US009562168B2

(12) United States Patent
Jing et al.

(10) Patent No.: US 9,562,168 B2
(45) Date of Patent: Feb. 7, 2017

(54) FLUOROPOLYMER COATINGS SUITABLE FOR FILMS OF PHOTOVOLTAIC MODULES

(71) Applicant: 3M INNOVATIVE PROPERTIES COMPANY, St. Paul, MN (US)

(72) Inventors: Naiyong Jing, Woodbury, MN (US); Mark W. Muggli, Emmerting (DE); Larry S. Hebert, Hudson, WI (US); Kevin M. Hamer, St. Paul, MN (US); Thomas J. Blong, Woodbury, MN (US); Michael Juergens, Moenchengladbach (DE); George Van Dyke Tiers, St. Paul, MN (US); Zhigang Yu, Shanghai (CN); Yaming Wang, Shanghai (CN); Yiwen Chu, Shanghai (CN)

( * ) Notice: Subject to any disclaimer, the term of this patent is extended or adjusted under 35 U.S.C. 154(b) by 0 days.

(21) Appl. No.: 14/925,226

(22) Filed: Oct. 28, 2015

(65) Prior Publication Data
US 2016/0046822 A1 Feb. 18, 2016

Related U.S. Application Data

(63) Continuation of application No. 14/425,645, filed as application No. PCT/CN2012/084609 on Nov. 14, 2012, now Pat. No. 9,221,990.

(51) Int. Cl.
| | |
|---|---|
| *C09D 127/22* | (2006.01) |
| *H01L 31/049* | (2014.01) |
| *C08K 3/20* | (2006.01) |
| *C08J 7/04* | (2006.01) |
| *C09D 127/18* | (2006.01) |
| *C09D 127/12* | (2006.01) |
| *C08K 5/544* | (2006.01) |
| *C08K 3/36* | (2006.01) |
| *C08K 9/04* | (2006.01) |
| *C08K 9/00* | (2006.01) |

(52) U.S. Cl.
CPC .............. *C09D 127/22* (2013.01); *C08J 7/047* (2013.01); *C08K 3/20* (2013.01); *C09D 127/12* (2013.01); *C09D 127/18* (2013.01); *H01L 31/049* (2014.12); *C08J 2367/02* (2013.01); *C08J 2427/12* (2013.01); *C08K 3/36* (2013.01); *C08K 5/544* (2013.01); *C08K 9/00* (2013.01); *C08K 9/04* (2013.01); *C08K 2201/011* (2013.01); *C08L 2205/02* (2013.01); *Y02E 10/50* (2013.01)

(58) Field of Classification Search
CPC ..... C08J 7/047; C08J 2367/02; C08J 2427/12; C08K 3/20; C08K 2201/011; C08K 3/36; C08K 5/544; C08K 9/04; C09D 127/18; C09D 127/22; H01L 31/049

USPC ................... 524/430, 439; 428/421
See application file for complete search history.

(56) References Cited

U.S. PATENT DOCUMENTS

| | | | |
|---|---|---|---|
| 5,656,121 A | 8/1997 | Fukushi | |
| 5,827,587 A | 10/1998 | Fukushi | |
| 5,855,977 A | 1/1999 | Fukushi | |
| 6,350,806 B1* | 2/2002 | Tsuda | C08K 3/36 524/269 |
| 6,759,129 B2 | 7/2004 | Fukushi | |
| 7,323,514 B2 | 1/2008 | Jing | |
| 7,351,471 B2 | 4/2008 | Jing | |
| 7,374,812 B2 | 5/2008 | Mizuno | |
| 7,473,462 B2 | 1/2009 | Coggio | |
| 7,485,371 B2 | 2/2009 | Jing | |
| 7,553,540 B2 | 6/2009 | Debergalis | |
| 7,638,581 B2 | 12/2009 | Jing | |
| 7,745,545 B2 | 6/2010 | Jing | |
| 7,981,478 B2 | 7/2011 | Snow | |
| 8,012,542 B2 | 9/2011 | Snow | |
| 8,025,928 B2 | 9/2011 | Snow | |
| 8,048,518 B2 | 11/2011 | DeBergalis | |
| 8,062,744 B2 | 11/2011 | DeBergalis | |
| 8,168,297 B2 | 5/2012 | Snow | |
| 8,197,933 B2 | 6/2012 | DeBergalis | |
| 2002/0197481 A1 | 12/2002 | Jing | |
| 2004/0244829 A1 | 12/2004 | Rearick | |
| 2005/0182199 A1 | 8/2005 | Jing | |

(Continued)

FOREIGN PATENT DOCUMENTS

| | | |
|---|---|---|
| JP | 2002290536 | 4/1999 |
| JP | 2000-290536 | 10/2000 |

(Continued)

OTHER PUBLICATIONS

3M™ Dyneon™ Fluoroplastic THV 340Z: Dyneon Product Catalogue: 3M Europe (2013) 1 page.
3M™ Dyneon™ Fluoroplastic THV 340Z Fluorothermoplastic Dispersion; Preliminary Technical Information, 2 pgs. 2011.
Dyneon™ THV Fluorothermoplastics Injection Molding Guidelines, Technical Information (Apr. 2001) 2 pgs.

(Continued)

Primary Examiner — Ling Choi
Assistant Examiner — Chun-Cheng Wang

(57) ABSTRACT

Presently described are methods of making coating comprising aqueous fluoropolymer latex dispersions, aqueous fluoropolymer coating compositions, coated substrates, and (e.g. backside) films of photovoltaic cells. In one embodiment, the film comprises at least one fluoropolymer comprising repeat units derived from VF, VDF, or a combination thereof; inorganic oxide nanoparticles; and a compound that reacts with the repeat units derived from VF and VDF to crosslink the fluoropolymer and/or couple the fluoropolymer to the inorganic oxide nanoparticles. In another embodiment, the backside film comprises at least one fluoropolymer comprising repeat units derived from VF, VDF, or a combination thereof; and an amino-substituted organosilane ester or ester equivalent crosslinking compound.

22 Claims, 1 Drawing Sheet

(56) References Cited

U.S. PATENT DOCUMENTS

| | | |
|---|---|---|
| 2005/0233150 A1 | 10/2005 | Jing |
| 2006/0147177 A1 | 7/2006 | Jing |
| 2006/0147724 A1 | 7/2006 | Mizuno |
| 2006/0148971 A1 | 7/2006 | Jing |
| 2006/0148996 A1 | 7/2006 | Coggio |
| 2007/0286994 A1 | 12/2007 | Walker |
| 2008/0064825 A1 | 3/2008 | Jing |
| 2008/0264484 A1 | 10/2008 | Temchenko |
| 2009/0029177 A1 | 1/2009 | Jing |
| 2009/0078314 A1 | 3/2009 | Temchenko |
| 2010/0036035 A1 | 2/2010 | Nelson |
| 2010/0154863 A1 | 6/2010 | Bennett |
| 2011/0025928 A1 | 2/2011 | Yokota |
| 2011/0045193 A1 | 2/2011 | Temchenko |
| 2011/0083726 A1 | 4/2011 | Takayanagi |
| 2011/0086954 A1 | 4/2011 | Snow |
| 2011/0108086 A1 | 5/2011 | Temchenko |
| 2011/0114148 A1 | 5/2011 | Temchenko |
| 2011/0120525 A1 | 5/2011 | Bennett |
| 2011/0279516 A1 | 11/2011 | Hu |
| 2011/0297313 A1 | 12/2011 | Samuels |
| 2011/0297314 A1 | 12/2011 | Samuels |
| 2012/0024351 A1 | 2/2012 | Prejean |
| 2012/0024450 A1 | 2/2012 | Samuels |
| 2012/0048352 A1 | 3/2012 | Nagato |
| 2012/0055105 A1 | 3/2012 | Kohl |
| 2012/0152323 A1 | 6/2012 | Perry |

FOREIGN PATENT DOCUMENTS

| | | |
|---|---|---|
| JP | 2002201227 | 12/2001 |
| JP | 2002-201227 | 7/2002 |
| JP | 2010-238759 | 10/2010 |
| JP | 2011-162598 | 8/2011 |
| JP | 2011162598 | 8/2011 |
| WO | WO 2007/008329 | 1/2007 |
| WO | WO 2007/149617 | 12/2007 |
| WO | 2008/079395 | 7/2008 |
| WO | WO 2010/093671 | 8/2010 |
| WO | WO 2011/002838 | 1/2011 |
| WO | WO 2011-006065 | 1/2011 |
| WO | WO 2011/087997 | 7/2011 |
| WO | WO 2012/058090 | 5/2012 |
| WO | WO 2012/067936 | 5/2012 |

OTHER PUBLICATIONS

International Search Report PCT/CN2012/084609; Aug. 22, 2013.

Water-Based FEVE Resin Technology for performance Improvements in Architectural Coatings; AGC Chemicals; Apr. 12, 2012, 39 pgs.

Liu et al.; "Super-hydrophobic surfaces from a simple coating method: a bionic nanoengineering approach"; Institute of Physics Publishing, Nanotechnology 17 (2006) 3529-3263.

* cited by examiner

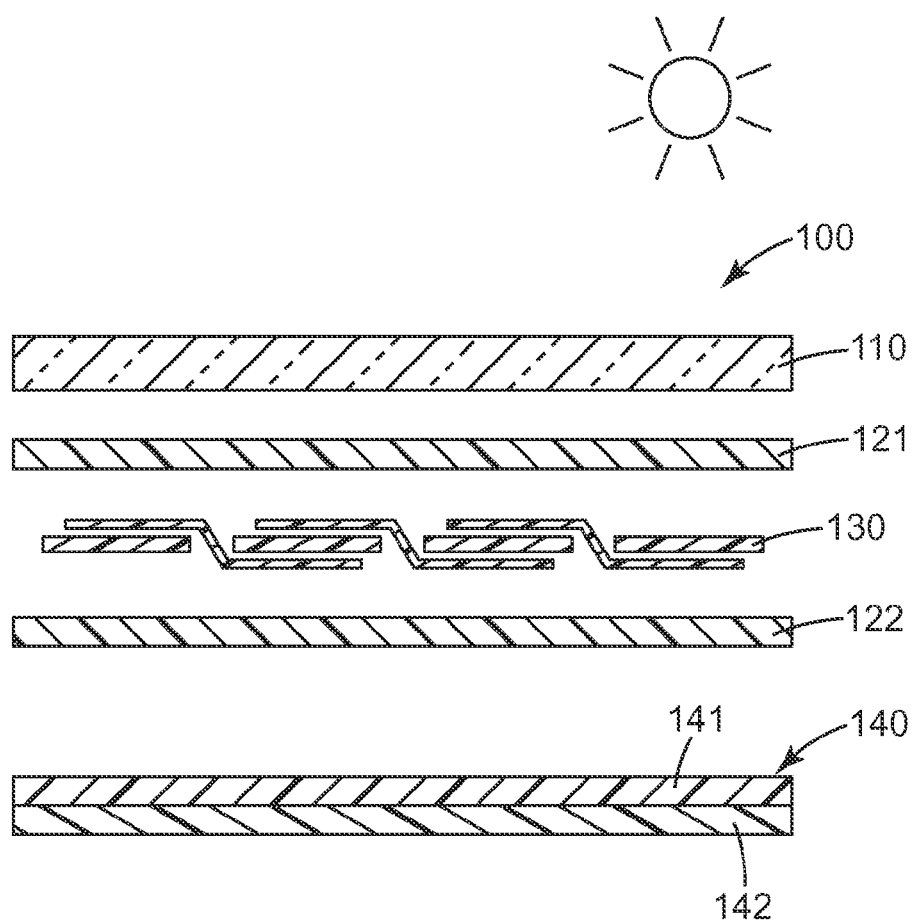

FLUOROPOLYMER COATINGS SUITABLE FOR FILMS OF PHOTOVOLTAIC MODULES

SUMMARY

In one embodiment, a method of making a coating composition is described. The method comprises providing an aqueous fluoropolymer latex dispersion. The dispersion comprises at least one fluoropolymer comprising repeat units derived from VF, VDF, or a combination thereof. The method comprises combining the aqueous fluoropolymer latex dispersion with inorganic oxide nanoparticles forming a mixture; adjusting the pH of the mixture to at least 8; and adding a compound that reacts with the repeat units derived from VF and VDF to crosslink the fluoropolymer and/or bond the fluoropolymer to the inorganic oxide nanoparticles. In favored embodiments, the compound comprises at least two amino groups, or at least one amino group and at least one alkoxy silane, such as provided by an amino-substituted organosilane ester or ester equivalent. In some embodiments, the method further comprises adding at least one second fluoropolymer (e.g. lacking repeat units derived from VF and/or VDF). The second fluoropolymer may comprise repeat units derived from TFE or chlorotrifluoroethylene, optionally in combination with repeat units derived from vinyl ether.

In another embodiment, a fluoropolymer coating composition is described comprising an aqueous liquid medium; fluoropolymer latex particles dispersed in the aqueous liquid medium wherein the fluoropolymer comprises repeat units derived from VF, VDF, or a combination thereof; inorganic oxide nanoparticles; and a compound that reacts with the repeat units derived from VF and VDF to crosslink the fluoropolymer and/or bond the fluoropolymer to the inorganic oxide nanoparticles.

In yet another embodiment, a coated substrate is described comprising a substrate wherein a surface of the substrate comprises the dried coating composition described herein.

In yet another embodiment, a photovoltaic module comprising a backside film is described. In one embodiment, the backside film comprises at least one fluoropolymer comprising repeat units derived from VF, VDF, or a combination thereof; and inorganic oxide nanoparticles. The repeat units derived from VF, VDF, or a combination thereof, are crosslinked and/or bonded to the inorganic oxide nanoparticles. In another embodiment, the backside film comprises at least one fluoropolymer comprising repeat units derived from VF, VDF, or a combination thereof; and an amino-substituted organosilane ester or ester equivalent crosslinking compound. In favored embodiments, the surface layer of the backside films comprises the fluoropolymer, inorganic oxide (e.g. silica) nanoparticles and an amino-substituted organosilane ester or ester equivalent crosslinking compound.

BRIEF DESCRIPTION OF THE DRAWINGS

FIG. 1 is a schematic cross-section of a photovoltaic cell.

DETAILED DESCRIPTION

The following definitions apply throughout the specification and claims.

The term "aqueous" means that the liquid of the coating contains at least 85 percent by weight of water. It may contain a higher amount of water such as, for example, at least 90, 95, or even at least 99 percent by weight of water or more. The aqueous liquid medium may comprise a mixture of water and one or more water-soluble organic cosolvent(s), in amounts such that the aqueous liquid medium forms a single phase. Examples of water-soluble organic cosolvents include methanol, ethanol, isopropanol, 2-methoxyethanol, 3-methoxypropanol, 1-methoxy-2-propanol, tetrahydrofuran, and ketone or ester solvents. The amount of organic cosolvent typically does not exceed 15 wt-% of the total liquids of the coating composition. The aqueous fluoropolymer coating described herein typically comprises at least 15 wt-% and typically no greater than about 80 wt-% aqueous liquid medium. In some embodiments, the aqueous fluoropolymer coating comprises no greater than 70 wt-%, 60 wt-%, 50 wt-%, or 40 wt-% aqueous liquid medium.

The term "nanoparticles" refers to particles with an average particle size of less than or equal to about 100 nanometers (nm).

A "dried" coating is a coating that has been applied from a coating composition that includes a liquid carrier (i.e. water and optionally cosolvent), and the liquid carrier has been substantially completely removed, for example by evaporation. A dried coating may also be cured (i.e., crosslinked) as a result of reaction between the reactive functional groups (e.g., amine groups of the crosslinking compound and VF or VDF of the fluoropolymer), for example during evaporation. The rate and degree of curing can typically be enhanced by heating the coating composition during or after the drying process.

The term "liquid" means liquid at a temperature of 25° C. and a pressure of 1 atm.

Fluoropolymers useful in the present invention comprise repeat units derived from vinyl fluoride (VF) and/or vinylidene fluoride ("VDF," "VF2,"). In some embodiments, the fluoropolymer is a homopolymer. In other embodiments, the fluoropolymer is a copolymer of VF and/or VDF and at least one other comonomer.

Examples of useful fluorinated comonomers include tetrafluoroethylene (TFE), hexafluoropropylene (HFP), chlorotrifluoroethylene (CTFE), trifluoroethylene, hexafluoroisobutylene, perfluorobutyl ethylene, perfluoro alkylvinyl ethers such as perfluoro (propyl vinyl ether) (PPVE) and perfluoro (ethyl vinyl ether) (PEVE), perfluoro (methyl vinyl ether) (PMVE), perfluoro-2,2-dimethyl-1,3-dioxole (PDD) and perfluoro-2-methylene-4-methyl-1,3-dioxolane (PMD) among many others.

The molar amount of vinylidene fluoride of the copolymer is typically at least 30 or 35 and typically no greater than 60. In some embodiments, the molar amount of vinylidene fluoride is no greater than 50. The fluorine content of the fluoropolymer is typically at least 60, 65, 66, 67, 68, 69, or 70 wt-% of the fluoropolymer and typically no greater than 75 wt-%. In some embodiments, the coating composition comprises one or more fluoropolymers in the absence of non-fluorinated polymeric binders. In such embodiments, the non-solvent organic portion of the coating composition (i.e. of the total non-aqueous composition except for the inorganic nanoparticles) also has a fluorine content in the range just described. However, the fluorine content of the organic portion is slightly lower than that of the fluoropolymer(s) due to the inclusion of a crosslinking/bonding compound that is typically non-fluorinated.

In some favored embodiments, the fluoropolymers are copolymers formed from the monomers tetrafluoroethylene ("TFE"), hexafluoropropylene ("HFP"), and vinylidene fluoride ("VDF," "VF2,"). Such monomer structures are shown as follows:

TFE: $CF_2=CF_2$
VDF: $CH_2=CF_2$
HFP: $CF_2=CF-CF_3$

The fluoropolymer may comprise or consist of repeat units derived from these three particular monomers in varying molar amounts. Such fluoropolymer may have the general formula:

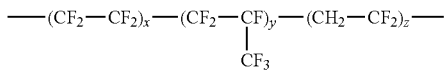

wherein x, y and z are expressed as molar percentages.

For thermoplastic fluoropolymers, x (i.e. TFE) is greater than zero and typically at least 20, 25, or 30 molar percent of the fluoropolymer. In some embodiments, x is no greater than 60 or 55. In other embodiments, x is not greater than 50. The molar amount of y (i.e. HFP) is typically at least 5, 6, 7, 8, 9, or 10 and less than about 15 molar percent. Further, the molar amount of z (i.e. VDF) is typically at least 30 or 35 and typically no greater than 60. In some embodiments, y is no greater than 50.

The thermoplastic fluoropolymers typically have a melt temperature ranging from about 200° C. to about 280° C. In some embodiments, the melt temperature is at least 210° C., 215° C., 220° C., or 225° C. The softening temperature ranges from about 115° C. to about 180° C. In some embodiments, the softening temperature is at least than 125° C., 130° C., 135° C. or 140° C. The melt temperature of the fluoropolymer is related to the temperature at which the dried coating can be heat laminated to another thermoplastic material, such as an (e.g. EVA) encapsulant and/or (e.g. PET) polymeric substrate film of a photovoltaic cell.

The fluoropolymer dispersed in the aqueous diluent is a film-forming polymer. Suitable polymer latexes and methods for making them are widely known in the art, and many are commercially available.

Typically, the particles in the fluoropolymer latexes are substantially spherical in shape. The polymer core may comprise one or more water-insoluble polymers, although this is not a requirement. Useful polymer particle sizes include those typical of latexes and other dispersions or emulsions. Typical polymer particle sizes are in a range of from about 0.01 micrometers to 100 micrometers, and more typically in a range of from 0.01 to 0.2 micrometers.

Examples of thermoplastic fluoropolymers are those available from 3M under the trade name Dyneon™ Fluoroplastic THV™ 200; Dyneon™ Fluoroplastic THV™ 300; Dyneon™ Fluoroplastic THV™ 400; Dyneon™ Fluoroplastic THV™ 500; and Dyneon™ Fluoroplastic THV™ 800 described in U.S. Pat. No. 7,323,514. Other fluoropolymers are available from Arkema Inc. Philadelphia, Pa. under the trade designation "Kynar".

The fluoropolymer coating composition typically comprises one or more fluoropolymers comprising repeat units derived from VF and/or VDF in an amount of at least 15, 16, 17, 18, 19, or 20 wt-% solids of the dried coating composition. The concentration of such fluoropolymers is typically no greater than about 95 wt-% solids (of the dried coating composition). In some embodiments, the coating composition comprises one or more fluoropolymers comprising repeat units derived from VF and/or VDF in an amount no greater than 90 or 85 or 80 wt-% solids of the dried coating composition. As the concentration of nanoparticles increases, the concentration of fluoropolymer decreases. In some embodiments, the amount of fluoropolymer comprising repeat units derived from VF and/or VDF is at least 25, 30, 35, 40 or 44 wt-% and typically no greater than 75, 70, or 65 wt-% of the dried coating composition.

In some embodiments, the coating composition comprises only fluoropolymer having repeat units derived from VF and/or VDF. The coating composition may comprise at least one second fluoropolymer that may comprise a lower mole-% of repeat units derived from VF and/or VDF. For example the other second fluoropolymer may comprise 1, 2, 3, 4, or 5 mole-% of repeat units derived from VF, VDF or a combination thereof, yet no greater than 14, 13, 12, 11 or 10 mole-%.

In other embodiments, the fluoropolymer(s) comprising repeat units derived from VF and/or VDF can be blended with at least one second fluoropolymer that lacks repeat units derived from VF and/or VDF. The second fluoropolymer is also typically a fluoropolymer latex. In some embodiments, the second fluoropolymer is a homopolymer or copolymer of TFE. In some embodiments, the second fluoropolymer is a copolymer of TFE and at least one non-fluorinated monomer such as a vinyl ether monomer. For example, the second fluoropolymer may be a copolymer of tetrafluoroethylene or chlorotrifluoroethylene compolymer and vinyl ether such as available from Zebon (Dalian, China) under the trade designation "ZBF500-1".

The fluoropolymer comprising repeat units derived from VF and/or VDF is combined with a compound that reacts with (at least a portion of the) repeat units derived from VF and/or VDF. Vinylidene fluoride or vinyl fluoride containing fluoropolymers can react with chemical species having nucleophilic groups such as $-NH_2$, $-SH$, and $-OH$, or their conjugate bases produced by deprotonation, via dehydrofluorination and Michael addition processes or via a single electron transfer process.

In some embodiments, the compound comprises at least two (e.g. amino) groups that react with VF and/or VDF repeat units, thereby crosslinking the fluoropolymer. In other embodiments, the compound comprises at least one (e.g. amino) group that reacts with VF and/or VDF repeat units, and at least one alkoxy silane group that bonds to the inorganic oxide nanoparticles. In both embodiments, the compound reacts with VF and/or VDF repeat units of the fluoropolymer and thus such a compound can be characterized as a "VF/VDF reactive compound". Further, the VF/VDF reactive compound is typically uniformly dispersed throughout the thickness of the applied and/or dried coating composition. The VF/VDF reactive compound typically lacks a polymeric backbone. Thus, the VF/VDF reactive compound typically has a relatively low molecular weight, such as no greater than 1000 g/mole.

In one favored embodiment, the coating composition comprises an amino-substituted organosilane ester or ester equivalent VF/VDF reactive compound. The reaction mechanism occurs with the fluoropolymer preferentially and substantially occurs at vinylidene fluoride groups that are located next to HFP groups in the THV fluoropolymer as shown as follows:

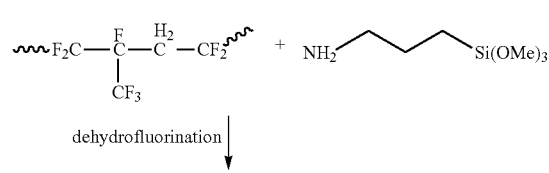

dehydrofluorination

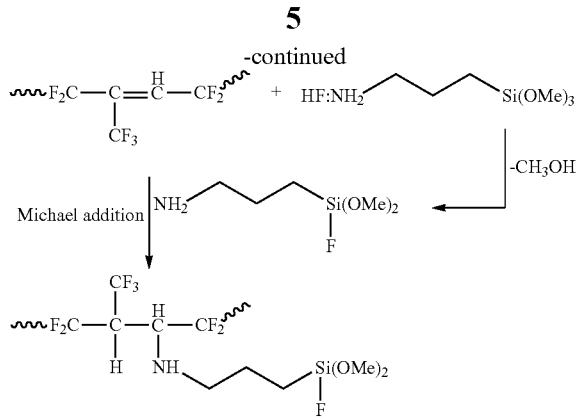

The amino-substituted organosilane ester or ester equivalent bears on the silicon atom at least one, and preferably 2 or 3 ester or ester equivalent groups. Ester equivalents are well known to those skilled in the art and include compounds such as silane amides (RNR'Si), silane alkanoates (RC(O)OSi), Si—O—Si, SiN(R)—Si, SiSR and RCONR'Si compounds that are thermally and/or catalytically displaceable by R"OH. R and R' are independently chosen and can include hydrogen, alkyl, arylalkyl, alkenyl, alkynyl, cycloalkyl, and substituted analogs such as alkoxyalkyl, aminoalkyl, and alkylaminoalkyl. R" may be the same as R and R' except it may not be H. These ester equivalents may also be cyclic such as those derived from ethylene glycol, ethanolamine, ethylenediamine and their amides.

Another such cyclic example of an ester equivalent is

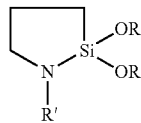

In this cyclic example R' is as defined in the preceding sentence except that it may not be aryl. 3-aminopropyl alkoxysilanes are well known to cyclize on heating and these RNHSi compounds would be useful in this invention. Preferably the amino-substituted organosilane ester or ester equivalent has ester groups such as methoxy that are easily volatilized as methanol so as to avoid leaving residue at the interface that may interfere with bonding. The amino-substituted organosilane must have at least one ester equivalent; for example, it may be a trialkoxysilane.

For example, the amino-substituted organosilane may have the formula (Z2N-L-SiX'X"X'"), wherein Z is hydrogen, alkyl, or substituted aryl or alkyl including amino-substituted alkyl; and
L is a divalent straight chain C1-12 alkylene or may comprise a C3-8 cycloalkylene, 3-8 membered ring heterocycloalkylene, C2-12 alkenylene, C4-8 cycloalkenylene, 3-8 membered ring heterocycloalkenylene or heteroarylene unit; and
each of X', X" and X'" is a C1-18 alkyl, halogen, C1-8 alkoxy, C1-8 alkylcarbonyloxy, or amino group, with the proviso that at least one of X', X", and X'" is a labile group. Further, any two or all of X', X" and X'" may be joined through a covalent bond. The amino group may be an alkylamino group.

L may be divalent aromatic or may be interrupted by one or more divalent aromatic groups or heteroatomic groups. The aromatic group may include a heteroaromatic. The heteroatom is preferably nitrogen, sulfur or oxygen. L is optionally substituted with C1-4 alkyl, C2-4 alkenyl, C2-4 alkynyl, C1-4 alkoxy, amino, C3-6 cycloalkyl, 3-6 membered heterocycloalkyl, monocyclic aryl, 5-6 membered ring heteroaryl, C1-4 alkylcarbonyloxy, C1-4 alkyloxycarbonyl, C1-4 alkylcarbonyl, formyl, C1-4 alkylcarbonylamino, or C1-4 aminocarbonyl. L is further optionally interrupted by —O—, —S—, —N(Rc)-, —N(Rc)-C(O)—, —N(Rc)-C(O)—O—, —O—C(O)—N(Rc)-, —N(Rc)-C(O)—N(Rd)-, —O—C(O)—, —C(O)—O—, or —O—C(O)—O—. Each of Rc and Rd, independently, is hydrogen, alkyl, alkenyl, alkynyl, alkoxyalkyl, aminoalkyl (primary, secondary or tertiary), or haloalkyl;

Examples of amino-substituted organosilanes include 3-aminopropyltrimethoxysilane (SILQUEST A-1110), 3-aminopropyltriethoxysilane (SILQUEST A-1100), 3-(2-aminoethyl)aminoprop-yltrimethoxysilane (SILQUEST A-1120), SILQUEST A-1130, (aminoethylaminomethyl) phenethyltrimethoxysilane, (aminoethylaminomethyl)-phenethyltriethoxysilane, N-(2-aminoethyl)-3-aminopropy-lmethyldimethoxysil-ane (SILQUEST A-2120), bis-(.gamma.-triethoxysilylpropyl)amine (SILQUEST A-1170), N-(2-aminoethyl)-3-aminopropyltributoxysilane, 6-(aminohexylaminopropyl)trimethoxysilane, 4-aminobutyltrimethoxysilane, 4-aminobutyltriethoxysilane, p-(2-aminoethyl)phenyltrimethoxysilane, 3-aminopropyltris(methoxyethoxyethoxy)silane, 3-aminopropylmethyldiethoxy-silane, oligomeric aminosilanes such as DYNASYLAN 1146, 3-(N-methylamino)propyltrimethoxysilane, N-(2-aminoethyl)-3-aminopropylm-ethyldimethoxysilane, N-(2-aminoethyl)-3-aminopropylmethyldiethoxysilane, N-(2-aminoethyl)-3-aminopropyltrimethoxysilane, N-(2-aminoethyl)-3-aminopropyltriethoxysilane, 3-aminopropylmethyldiethoxysilane, 3-aminopropylmethyldimethoxysilane, 3-aminopropyldimethylmethoxysilane, 3-aminopropyldimethylethoxysilane, 2

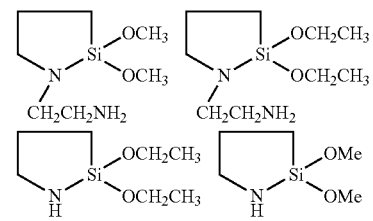

Additional "precursor" compounds such as a bis-silyl urea [RO)$_3$Si(CH$_2$)NR]$_2$C=O are also examples of amino-substituted organosilane ester or ester equivalent that liberate amine by first dissociating thermally. The amount of aminosilane is between 0.01% and 10% by weight relative to the functional polymer, preferably between 0.03% and 3%, and more preferably between 0.1% and 1%. As functional polymers differ, this amount will be chosen to provide the ability for melt-processing such as extrusion while typically maximizing the amine content of the silane-modified polymer, a simple task for one skilled in the art of melt-processing. Since it is preferred to maintain melt processability of the polymer the type of aminosilane ester or ester equivalent may need be adjusted to accommodate this. For example, if a very high molecular weight starting polymer is reacted with an aminosilane ester or ester equivalent with a T-type siloxy structure the resulting polymer may not be melt processable. In this case, one skilled in the art might substitute a D-type or even an M-type siloxy structure for the aminosilane ester or ester equivalent to allow melt processability of the resulting polymer.

The aminosilane preferably includes primary amine(s). Primary amine content may be determined by an analytical scheme involving reaction of the amine with a benzaldehyde derivative containing a "taggant" atom such as sulfur (e.g. 4-methylthiobenzaldehyde-). "Taggant" means having an easily analyzable substituent such as sulfur or bromine, etc. If for example the starting polymer had high levels of sulfur one skilled in the art would use a determinable benzaldehyde such as 4-bromobenzaldehyde. Other sufficiently sensitive tagging procedures, for example, might include fluorine by NMR, radiochemical methods such as carbon-14 or tritium, an attached dye or colored group by visible or UV spectroscopy, or X-ray fluorescence. The total non-tertiary amine content can be measured by using known reactions such as the reaction of appropriately tagged aliphatic or aromatic sulfonyl fluorides as in the presence of tertiary amines to form sulfonamides.

The aqueous coating composition typically comprises at least 0.1, 0.5, 1, 1.5, 2, 2.5, or 3 wt-% solids of VF/VDF reactive compound(s), such as an amine-substituted hydrolyzable silane. The concentration of VF/VDF reactive compound in the aqeuous coating composition is typically no greater than 10, 9, 8, 6, or 5 wt-% solids.

In some embodiments, the VF/VDF reactive compound (e.g. amine-substituted organosilane ester or ester equivalent) is the primary or sole crosslinking mechanism. Thus, the coating composition lacks other types of crosslinking, such as photocrosslinking by inclusion of a multi-olefinic (meth)acrylate crosslinker, such as described in U.S. Pat. No. 7,323,514.

Mechanical properties, such as abrasion resistance and pencil hardness, can be enhanced by the introduction of inorganic particles. The inorganic oxide particles are nanoparticles, having an average primary or agglomerate particle size diameter of at least 1, 2, 3, 4, or 5 nanometers and typically no greater than 80, 90 or 100 nanometers. The average particle size of the nanoparticles of the cured coating can be measured using transmission electron microscopy. The average particle size of the nanoparticles of the coating solution can be measured using dynamic light scattering. "Agglomerate" refers to a weak association between primary particles which may be held together by charge or polarity and can be broken down into smaller entities. "Primary particle size" refers to the mean diameter of a single (non-aggregate, non-agglomerate) particle. Unlike fumed silica that comprises silica aggregates, in favored embodiments the nanoparticles utilized herein comprise a sufficient concentration of discrete unaggregated nanoparticles. As used herein "aggregate" with respect to particles refers to strongly bonded or fused particles where the resulting external surface area may be significantly smaller than the sum of calculated surface areas of the individual components. The forces holding an aggregate together are strong forces, for example covalent bonds, or those resulting from sintering or complex physical entanglement. Although agglomerated nanoparticles can be broken down into smaller entities such as discrete primary particles such as by application of a surface treatment; the application of a surface treatment to an aggregate simply results in a surface treated aggregate. In some embodiments, a majority of the nanoparticles (i.e. at least 50%) are present as discrete unagglomerated nanoparticles. For example, at least 70%, 80% or 90% of the nanoparticles are present as discrete unagglomerated nanoparticles.

Preferably, the nanoparticles of the present disclosure include silica. Nanoparticles can include essentially only silica (although other oxides can be used, such as $ZrO_2$, colloidal zirconia, $Al_2O_3$, colloidal alumina, $CeO_2$, colloidal ceria, $SnO_2$, colloidal tin (stannic) oxide, $TiO_2$, colloidal titanium dioxide), or they can be composite nanoparticles such as core-shell nanoparticles. A core-shell nanoparticle can include a core of an oxide (e.g., iron oxide) or metal (e.g., gold or silver) of one type and a shell of silica deposited on the core. Herein, "silica nanoparticles" refer to nanoparticles that include only silica as well as core-shell nanoparticles with a surface that includes silica.

The concentration of (e.g. silica) inorganic nanoparticles is typically at least 5, 6, 7, 8, 9, or 10 wt-% solids of the dried coating composition. The concentration of (e.g. silica) inorganic nanoparticles is typically no greater than 60 or 55 wt-% solids. In some embodiments, the dried coating compositions comprises at least 11, 12, 13, 14 or 15 wt-% of (e.g. silica) inorganic nanoparticles. In some embodiments, the dried coating compositions comprises no greater than 50, 45 or 40 wt-% of (e.g. silica) inorganic nanoparticles.

The nanoparticles are typically relatively uniform in size. The variability in the size of the nanoparticles is typically less than 25 percent of the mean particle size. The nanoparticles typically have a surface area of at least 10 $m^2/gram$, 20 $m^2/gram$, or 25 $m^2/gram$. Further, the nanoparticles generally have a surface area of no greater than 750 $m^2/gram$.

In some embodiments the (e.g. silica) nanoparticles have a relatively small average particle size. For example, the average primary or agglomerate particle size may be less than 30 nm, or 25 nm, or 20 nm, or 15 nm. When such smaller nanoparticles are employed, it is typically preferred that such nanoparticles are surface modified with a hydrophilic surface treatment such as 3-glycidoxylpropyl trimethoxy silane. Hydrophilic organosilane surface treatments typically lack a longer chain alkyl group having 4 or more carbon atoms. Hydrophilic organosilane surface treatments typically comprise other hydrophilic groups such as alkylene oxide groups, acids and salts, as well as alcohols. Suitable hydrophilic surface treatments include polyethyleneoxide/polypropyleneoxide trialkoxysilane, sulfonato-organosilanols, also called organosilanol-sulfonic acids/salts having chemical structures like those below. The synthesis of some of such surface treatments is described in U.S. Pat. No. 4,338,377 and U.S. Pat. No. 4,152,165. Representative surface treatments include $NaOSi(OH)_2(CH_2)_3SO_3Na$, $(OH)_3Si(CH_2)_3OCH_2CH(OH)CH_2SO_3H$, 3-hydroxyl propyl trimethoxysilane, and carboxylate silane. Since the coating compositions are not subjected to photocrosslinking, the (e.g. silica) nanoparticles typically do not comprise a surface treatment having a vinyl or (meth)acrylate moiety.

In the absence of surface modification of such relatively small nanoparticles, the coating can exhibit short solution shelf-life time. However, when the (e.g. silica) inorganic oxide nanoparticles have an average particle size of greater than 20 nm, the nanoparticles do not require surface modification to provide useful solution stability. Thus the nanoparticles are "unmodified nanoparticles" since the nanoparticles do not comprise a surface treatment. It is appreciated however, that unmodified silica nanoparticles commonly comprise hydroxyl or silanol functional groups on the nanoparticle surface, particularly when the nanoparticles are provided in the form of an aqueous dispersion. Further, the larger nanoparticles can optionally be surface modified with the hydrophilic surface treatments previously described.

Inorganic silica sols in aqueous media are well known in the art and available commercially. Silica sols in water or water-alcohol solutions are available commercially under such trade names as LUDOX (manufactured by E.I. duPont de Nemours and Co., Inc., Wilmington, Del.), NYACOL (available from Nyacol Co., Ashland, Mass.) or NALCO (manufactured by Nalco Chemical Co., Oak Brook, Ill.). Some useful silica sols are NALCO 1115, 2326, 1050, 2327, and 2329 available as silica sols with mean particle sizes of 4 nanometers (nm) to 77 nm. Another useful silica sol is NALCO 1034a available as a silica sol with mean particle size of 20 nanometers. Another useful silica sol is NALCO 2326 available as a silica sol with mean particle size of 5 nanometers. Additional examples of suitable colloidal silicas are described in U.S. Pat. No. 5,126,394.

In some embodiments, the silica nanoparticles used in coating compositions are acicular. The term "acicular" refers to the general needle-like, elongated shape of the particles and may include other string-like, rod-like, chain-like shapes, as well as filamentary shapes. The acicular colloidal silica particles may have a uniform thickness of 5 to 25 nm, a length, Di, of 40 to 500 nm (as measured by dynamic light-scattering method) and a degree of elongation D1/D2 of 5 to 30, wherein D2 means a diameter in nm calculated by the equation $D_2=2720/S$ and S means specific surface area in $m^2/g$ of the particle, as is disclosed in the specification of U.S. Pat. No. 5,221,497.

U.S. Pat. No. 5,221,497 discloses a method for producing acicular silica nanoparticles by adding water-soluble calcium salt, magnesium salt or mixtures thereof to an aqueous colloidal solution of active silicic acid or acidic silica sol having a mean particle diameter of 3 to 30 nm in an amount of 0.15 to 1.00 weight percent based on CaO, MgO or both to silica, then adding an alkali metal hydroxide so that the molar ratio of $SiO_2/M_2O$ (M: alkali metal atom) becomes 20 to 300, and heating the obtained liquid at 60 to 300 degrees centigrade for 0.5 to 40 hours. The colloidal silica particles obtained by this method are elongate-shaped silica particles that have elongations of a uniform thickness within the range of 5 to 40 nm extending in only one plane. Acicular silica sol may also be prepared as described in U.S. Pat. No. 5,597,512.

Useful acicular silica particles may be obtained as an aqueous suspension under the trade name SNOWTEX-UP by Nissan Chemical Industries (Tokyo, Japan). The mixture consists of 20-21 percent (w/w) of acicular silica, less than 0.35 percent (w/w) of $Na_2O$, and water. The particles are 9 to 15 nanometers in diameter and have lengths of 40 to 300 nanometers. The suspension has a viscosity of less than 100 mPas at 25 Degrees centigrade a pH of 9 to 10.5, and a specific gravity of 1.13 at 2O degrees centigrade.

The silica sols used in the present disclosure generally can include counter cations, in order to counter the surface charge of the colloids. Examples of cations suitable for use as counter ions for negatively charged colloids include $Na^+$, $K^+$, $Li^+$, a quaternary ammonium cation such as $NR_4^+$, wherein each R can be any monovalent moiety, but is preferably H or lower alkyl, such as —$CH_3$, combinations of these, and the like.

The coating is generally prepared by providing an aqueous fluoropolymer latex dispersion. A single fluoropolymer latex may be utilized or a combination of latex dispersion wherein the fluoropolymer of the first dispersion is different from the second dispersions. When a blend of aqueous fluoropolymer latex dispersions are employed, more than one of the fluoropolymers of the blend may comprise repeat units derived from VF and/or VDF. Alternatively the blend may comprise at least one fluoropolymer that comprises repeat units derived from VF and/or VDF and a second fluoropolymer lacking such repeat units.

The method of making the coating entails combining the aqueous fluoropolymer latex dispersion with inorganic oxide nanoparticles forming a mixture. The inorganic oxide nanoparticles are typically also provided as an aqueous dispersion. The method further comprises adjusting the pH of the mixture to be sufficiently basic such as by addition of ammonia. Once adjusted, the coating can have a pH of at least 8, 8.5, 9, 9.5, 10, 10.5, 11, 11.5 or 12. The method further comprises adding the crosslinking/bonding compound that reacts with the VF and/or VDF, thereby crosslinking the fluoropolymer and/or bonding the fluoropolymer to the inorganic oxide nanoparticles.

Although the coating composition comprises water as the primary liquid component, in some embodiments, the coating composition may optionally comprise a small amount of an organic cosolvent. For example, organic cosolvents may be present in the commercially available aqueous dispersions of the fluoropolymer latex and/or inorganic oxide nanoparticles. The concentration of the organic cosolvent is typically no greater than 15 wt-% of the total liquids of the coating composition. In some embodiments, the organic cosolvent is no greater than 10 or 5 wt-% of the total liquids of the coating composition.

The coating composition may optionally comprise various additives as known in the art including for example thickeners (such as clay available from Southern Clay Product Inc., Gonzales, Tex., under the trade designation "LAPRD"), pigments including $TiO_2$ or carbon black, fillers, as well as one or more light stabilizers. Light stabilizer additives include compounds that absorb ultraviolet radiation such as hydroxybenzophenones and hydroxybenzotriazoles. Other possible light stabilizer additives include hindered amine light stabilizers (HALS) and antioxidants. Thermal stabilizers can also be used if desired.

The coating composition may optionally comprise a non-fluorinated polymeric binder, such as a polyurethane, in an amount up to about 5 or 10 wt-%.

In one embodiment, the fluoropolymer coating composition includes barrier particles, such as described in U.S. Pat. No. 8,025,928. Such particles are platelet-shaped particles. Such particles tend to align during application of the coating and, since water, solvent and gases such as oxygen cannot pass readily through the particles themselves, a mechanical barrier is formed in the resulting coating which reduces permeation of water, solvent and gases. In a photovoltaic module, for example, the barrier particles substantially increase the moisture barrier properties of the fluoropolymer and enhance the protection provided to the solar cells. Barrier particles can be in amount from about 0.5 to about 10% by weight based on the total dry weight of the fluoropolymer composition in the coating.

Examples of typical platelet shaped filler particles include mica, glass flake and stainless steel flake, and aluminum flake. In one embodiment, the platelet shaped particles are mica particles, including mica particles coated with an oxide layer such as iron or titanium oxide. In some embodiments, these particles have an average particle size of about 10 to 200 microns in more specific embodiments 20 to 100 microns with no more than 50% of the particles of flake having average particle size of more than about 300 microns.

The fluoropolymer coating described herein can be used to prepare a coated substrate wherein a surface of the substrate comprises the dried coating composition. In some embodiments, the substrate may be an inorganic substrate, such as glass, or polymeric substrate. In other embodiments, the substrate is a polymeric substrate. Polymeric substrates can be made of polyester (e.g., polyethylene terephthalate (PET), polybutylene terephthalate), polycarbonate (PC), allyldiglycolcarbonate, polyacrylates such as polymethylmethacrylate, polystyrene, polysulfone, polyethersulfone, cellulose acetate butyrate, glass, polyolefin, PVC and the like, including blends and laminates thereof.

In some embodiments, the substrate is a planar substrate such as a panel or film substrate. The thickness of the substrate can vary, but typically ranges from about 2 mils to about 30 mils.

The surface of the (e.g. polymeric) substrate which is to be coated may be modified to improve adhesion such as by inclusion of a primer, electrical discharge such as corona treatment or by atmospheric nitrogen plasma treatment. However, the coating composition described herein has been found to exhibit good adhesion to polyester, and other fluoropolymers in the absence of such modification. Thus the fluoropolymer may be bonded directly to the (e.g. polyester) substrate in the absence of a primer or a tie layer, typically comprised of a different material.

In some embodiments, the substrate is light transmissive, having light transmission of at least 300 nm to 1200 nm.

The aqueous fluoropolymer coating compositions for making the fluoropolymer coated film can be applied as a liquid directly to suitable polymeric substrate films by conventional coating means such as spray, roll, knife, curtain, gravure coaters, or any other method that permits the application of a uniform coating. In some embodiments, the coating thickness of the dried coating is between about 2.5 microns (0.1 mil) and about 250 microns (10 mils). In some embodiments the dried coating has a thickness no greater than 20 microns, or 15 microns, or 10 microns. A single coating or multiple coating can be applied to obtain the desired thickness.

After application, the water (and optional cosolvent) is removed, and the fluoropolymer coating is adhered to the (e.g. polymeric) substrate (e.g. film). In some embodiments the coating compositions can be coated onto the substrate and allowed to air dry at ambient temperatures. Although not necessary to produce a coalesced film, heating is generally desirable for crosslinking and to dry the coating more quickly. The coated substrate can be subjected to a single heating step or by multiple heating steps. The drying temperature can range from room temperature to oven temperatures in excess of that required for the coalescence of fluoropolymers. Thus, the drying temperature can be in the range of about 25° C. to about 200° C. The drying temperature can increase as the concentration of TFE increase. In some embodiments, the drying temperature is least about 125° C., 130° C., 135° C., 140° C., 145° C., or 160° C. Typically, the drying temperature is selected based on the melting temperature of a selected fluoropolymer resin.

Fluoropolymer coated films are especially useful in photovoltaic modules that convert solar energy to electrical energy. With reference to FIG. 1, a typical construction for a photovoltaic module 100 includes a thick layer of glass 110 as a glazing material. The glass protects solar cells comprising crystalline silicon wafers and wires 130 that are embedded in a moisture resisting plastic sealing (e.g. encapsulant) compound 121, and 122 such as cross-linked ethylene vinyl acetate. Typically 130 includes two wafers of doped silicon (p-type and n-type) in contact to form a junction with each wafer having an electrical connection. As an alternative to crystalline silicon wafers and wires, thin film solar cells can be applied from various semiconductor materials, such as CIGS (copper-indium-gallium-selenide), CTS (cadmium-tellurium-sulfide), a-Si (amorphous silicon) and others on a carrier sheet which is also jacketed on both sides with encapsulant materials (121, 122). The encapsulant 122 is bonded to a backsheet 140. Fluoropolymer coated films 140 are useful for such backsheet. In one embodiment, the polymeric substrate film is a polyester 141, and in a more specific embodiment, a polyester selected from the group consisting of polyethylene terephthalate, polyethylene naphthalate and a coextrudate of polyethylene terephthalate/polyethylene naphthalate. In one embodiment the polymeric substrate is a heat sealable film such as 3M™ Scotchpak™ Heat Sealable Polyester Film that comprises PET combined with olefinic polymers such as ethylene vinyl acetate (EVA). Polyester provides electrical insulation and moisture barrier properties, and is an economical component of the backsheet. The dried fluoropolymer coating described herein forms the outer layer 142 that is typically exposed to the environment. In another embodiment, (not shown) both surfaces of the polymeric substrate film 141 are coated with fluoropolymer creating a sandwich of polyester between two layers of coating of fluoropolymer. In some embodiments, the fluoropolymer layer may be bonded directly to the (e.g. EVA) encapsulant. Fluoropolymer films provide excellent strength, weather resistance, UV resistance, and moisture barrier properties to the backsheet.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Materials

Unless otherwise noted, all parts, percentages, ratios, etc., in the examples and in the remainder of the specification are by weight. Unless otherwise noted, all chemicals were obtained or are available from, chemical suppliers such as Aldrich Chemical Company, Milwaukee, Wis.

"NALCO 1115" was silica nanoparticle dispersion, 4 nm, obtained from Nalco Company, Naperville, Ill., under trade designation "NALCO 1115".

"NALCO 1050" was silica nanoparticle dispersion, 20 nm, obtained from Nalco Company, Naperville, Ill., under trade designation "NALCO 1050".

"NALCO 2329" was silica nanoparticle dispersion, 75 nm, obtained from Nalco Company, Naperville, Ill., under trade designation "NALCO 2329".

"NALCO DVZN" was silica nanoparticle dispersion, 45 nm, obtained from Nalco Company, Naperville, Ill., under trade designation "NALCO DVZN004 CATALYST SUPPORT"

"SNOWTEX UP" was silica nanoparticle dispersion, obtained from Nissan Chemical, Houston, Tex. under trade designation "SNOWTEX UP".

"THV340Z" was a dispersion (50 wt. %) of a polymer of tetrafluoroethylene, hexafluoropropylene and vinylidene fluoride obtained from 3M Company, St. Paul, Minn. under trade designation "3M DYNEON FLUOROPLASTIC DISPERSION THV 340Z".

"THV500" was a dispersion (50 wt. %) of a polymer of tetrafluoroethylene, hexafluoropropylene and vinylidene fluoride obtained from 3M Company, St. Paul, Minn. under trade designation "3M DYNEON THV 500 FLUOROPLASTIC".

"PTFE 5032" was polytetrafluoroethylene dispersion obtained from 3M Company, St. Paul, Minn. under trade designation "3M DYNEON TF5032 PTFE".

"APS" was 3-(aminoethyl)aminopropyl trimethoxysilane obtained from Sigma-Aldrich Chemical Company, St. Louis, Mo.

"ZBF500-1" was a water-based fluoropolymer obtained from Zebon (Dalian, China). 3-glycidoxypropyltrimethoxysilane was obtained from Alfa-Aesar, Ward Hill, Mass.

R-966 polyurethane dispersion, obtained from Royal DSM N.V., Harleen, Netherlands Cross Hatch Adhesion Test The coated samples about 5 cm×5 cm in size on 50 micrometer-thick PET substrates prepared as described below were cut (cross hatched) on their coated side to form about 16 squares using a sharp razor blade. The cut samples were immersed in water at 50° C. overnight. Then the coated samples were removed from water, wiped and an adhesive tape was stuck on their coated side. The number of squares removed from the coated side of PET substrate with the adhesive tape was recorded to indicate the adhesion quality of the coatings to the PET substrate.

The described fluoropolymer coated samples were heat laminated to fluoropolymer films comprised of THV 500 or THV 610 having a thickness of 2-4 mils. The resulting laminated samples were then placed between two PTFE sheets and pressed for 1 minute at 200° C. with pressure (50-100 pounds per inch on average) applied between two heated platens of a Wabash Hydraulic press and then the laminates and immediately transferred to a cold press. After cooling to room temperature by a "cold press", the laminates were subjected to water immersion at 50° C. overnight. The strength of adhesion of the coatings of the invention to the fluoropolymer coating was evaluated.

Pencil Hardness

The surfaces of the coated samples prepared in Examples below were scratched with ASTM standard pencil of varying hardness (i.e., 2H, 3H, and so on). The tracks of pencil scratch on the coatings were then examined by a microscope. If the PET was not scratched but was compressed to form the pencil grooves, and the coating is undamaged the test was repeated with another pencil with higher hardness. The highest pencil hardness that the coatings could handle without damage was determined and reported.

Preparative Example 1 (PE1)

Into 150 mL glass jars were separately placed NALCO 1050 (40 g, 50 wt % aqueous) and 40 g D. I. water. To each jar 3-glycidoxypropyl trimethoxysilane (12.4 mmol, 2.93 g in 8 g ethanol for 100% coverage, and 3.1 mmol, 0.73 g in 3 g ethanol for 25% coverage) was slowly added, and both solutions were kept stirring at room temperature. Then the two solutions were mixed while stirring at 60 C. Very lightly blue dispersion containing surface modified silica nanoparticles was obtained.

Preparative Example 2 (PE2)

Into 150 mL glass jars were separately placed NALCO 2329 (40 g, 50 wt % aqueous) and 40 g D. I. water. To each jar 3-glycidoxypropyl trimethoxysilane (2.7 mmol, 0.64 g in 9 g ethanol for 100% coverage, and 1.3 mmol, 0.31 g in 3 g ethanol for 50% coverage) was slowly added, and both solutions were kept stirring at room temperature. Then the two solutions were mixed while stirring at 60° C. Very lightly blue dispersion containing surface modified silica nanoparticles was obtained.

Preparative Example 3 (PE3)

Into 150 mL glass jars were separately placed NALCO 1115 (100 g, 16 wt % aqueous). To each jar 3-glycidoxypropyl trimethoxysilane (51.2 mmol, 12.1 g in 15 g ethanol for 100% coverage, and 25.6 mmol, 6.05 g in 10 g ethanol for 50% coverage) was slowly added, and both solutions were kept stirring at room temperature. Then the two solutions were mixed while stirring at 60° C. Clear dispersions containing surface modified silica nanoparticles were obtained.

Examples 1-7 (EX1-EX7)

For EX1-EX7, first THV 340Z latex was diluted to 10, 20, or 40 wt. % using de-ionized (DI) water. To the diluted THV 340Z dispersions was added various nanosilica dispersions with desired particle size so that the ratio of THV340Z to silica nanoparticle dispersion was 90:10 by weight. The surfaces of the silica nanoparticles were modified with 3-glycidoxypropyl trimethoxysilane as described above in PE1 and PE2 for 100% coverage. Aqueous ammonium hydroxide was added to adjust the pH of the mixed dispersion to 9.5-10.5, and 3-(2-aminoethyl)aminopropyltrimethoxysilane was added to the dispersion. The amount of 3-(2-aminoethyl)aminopropyltrimethoxysilane in the resulting dispersion was 2, 3, 4, or 5 wt. % solids of the total coating composition.

Each of EX1-EX7 coating dispersions were coated on a PET substrate. EX1-EX 5 were coated using #12 Meyer bar while EX6-EX7 were coated using a #6 Meyer bar. For all the examples described herein a #12 Meyer bar provides a dried coating thickness of 2 to 10 microns depending on the dilution factor; whereas a #6 Meyer bar provides a dried coating thickness of about 0.5 microns to 6 microns depending on the dilution factor.

The coated films were heated at 150-160° C. for 10 minutes to provide the desired fluoropolymer composite coating and the samples were tested for their abrasion resistance, pencil hardness as described above and the optical quality of the coatings were observed. Table 1, below, summarizes the compositions of the coating dispersions and the test data for EX1-EX7. The wt-% solids of each of the components in the dried coating composition are depicted in parenthesis.

TABLE 1

| | Coating dispersion | | | | |
|---|---|---|---|---|---|
| Example | THV 340Z Dilution (wt. %) | Silica Nanoparticle | Wt. % APS | Pencil Hardness | Optical Quality |
| EX1 | 10 (87%) | NALCO 1050 (10%) | 3 (3%) | 3H | Excellent, clear and very little color |
| EX2 | 10 (85%) | NALCO 1050 (10%) | 5 (5%) | 3H | Non-uniform, yellow spots and thick haze in some areas |

TABLE 1-continued

| Example | THV 340Z Dilution (wt. %) | Silica Nanoparticle | Wt. % APS | Pencil Hardness | Optical Quality |
|---|---|---|---|---|---|
| EX3 | 20 (87%) | NALCO 2329 (10%) | 3 (3%) | 4H | Excellent, slight haze and very little color |
| EX4 | 20 (85%) | NALCO 2329 (10%) | 5 (5%) | 4H | Excellent, slight haze and very little color |
| EX5 | 20 (87%) | NALCO 1050 (10%) | 3 (3%) | 4H | Excellent, clear and very little color |
| EX6 | 40 (86%) | NALCO 2329 (10%) | 4 (4%) | 3H | Excellent, clear and very little color |
| EX7 | 40 (88%) | NALCO 2329 (10%) | 2 (2%) | 3H | Excellent, clear and very little color |

Examples 8-18 (EX8-EX18)

EX8-EX17 were prepared in the same manner as EX1-EX7, except that the silica nanoparticles were not surface modified. Ex18 was surface modified in the same manner as EX1-EX-7. The weight ratio of THV 340Z to silica nanoparticle dispersion was 90:10 for EX8-11 and EX13-EX18. The weight ratio of THV 340Z to silica nanoparticle dispersion was 70:30 for EX12. EX8-EX17 were coated using a #12 Meyer bar while EX18 was coated using a #6 Meyer bar. EX18 was coated on a glass substrate instead of a PET substrate. Table 2, below, summarizes the compositions of the coating dispersions and the test data for EX8-EX18. The wt-% solids of each of the components of the dried coating composition is depicted in parenthesis.

TABLE 2

| Example | THV 340Z Dilution (wt. %) | Silica Nanoparticle | Wt. % APS | Pencil Hardness | Optical Quality |
|---|---|---|---|---|---|
| EX8 | 20 (87%) | NALCO 2329 (10%) | 3 (3%) | 4H | Excellent, clear and very little color |
| Comp. | 20 | None | 3 | 2H | Excellent, clear |
| EX9 | (97%) | | (3%) | | and very little color |
| EX10 | 40 (87%) | NALCO 2329 (10%) | 3 (3%) | 4H | Excellent, clear and very little color |
| Comp. EX11 | 40 (97%) | None | 3 (3%) | 2H | Excellent, clear and very little color |
| EX12 | 20 (65%) | NALCO 1050 (30%) | 5 (5%) | 2H-3H | Good, slight haze and white-yellow color |
| EX13 | 40 (87%) | NALCO 1050 (10%) | 3 (3%) | 4H | Excellent, clear but extremely yellow |
| EX14 | 20 (87%) | NALCO DVZN (10%) | 3 (3%) | 2H-3H | Good, slight haze and white-yellow color |
| EX15 | 20 (85%) | NALCO DVZN (10%) | 5 (5%) | 2H-3H | Good, slight haze and white-yellow color |
| EX16 | 40 (87%) | SNOWTEX UP (10%) | 3 (3%) | 2H-3H | Excellent |
| EX17 | 20 (87%) | SNOWTEX UP (10%) | 3 (3%) | 2H-3H | Excellent |
| EX18 | 10 (89%) | NALCO 1115 (10%) | 1 (1%) | | Excellent, clear and very little color |

The resulting dried coatings of EX 8 and EX12 on PET substrates were tested using the cross hatch adhesion test described above. Table 4, below, summarizes the compositions of the coating dispersions and the test data.

TABLE 4

| Example | THV 340Z Dilution (wt. %) | Silica Nanoparticle | Wt. % APS | Cross-hatch adhesion to PET | Cross-hatch adhesion to white PET | Adhesion* to THV 500 coating | Adhesion* to THV 610 coating |
|---|---|---|---|---|---|---|---|
| EX 8 | 20 | NALCO 2329 | 3 | 0 squares came off | 0 squares came off | Very strong | Very strong |
| EX 12 | 20 | NALCO 1050 | 5 | 0 squares came off | 0 squares came off | Very strong | Very strong |

*Adhesion of the dried coating heat laminated

Example 19-27 (EX19-EX27)

For EX19-EX27, first THV 340Z latex was diluted to 20 or 40 wt. % using de-ionized (DI) water. To the diluted THV 340Z latex was added various nanosilica dispersions with desired particle size so that the ratio of THV340Z to silica nanoparticle dispersion was 90:10 by weight. Aqueous ammonium hydroxide was added to adjust the pH of the mixed dispersion to 9.5-10.5, and 3-(2-aminoethyl)amino-propyl-trimethoxysilane 3 wt. % solids. To the above dispersion a desired amount of PTFE 5032 and 2 wt. % solids of R-966 was added. The ratio of THV 340Z to PTFE 5032 was varied. The wt-% solids of each of the components in the dried coating composition are depicted in parenthesis. Each of EX19-EX27 coating dispersions were coated on a PET substrate.

EX19-EX27 were coated using #12 Meyer bar while EX22-27 were coated using a #6 Meyer bar. The coated films were heated at 150-160° C. for 10 minutes to provide the desired fluoropolymer composite coating and the samples were tested for pencil hardness and the optical quality of the coatings were observed. Table 5, below, summarizes the compositions of the coating dispersions and the test data for EX19-EX27.

TABLE 5

| | Coating dispersion | | | |
|---|---|---|---|---|
| Example | THV 340Z Dilution (85%) | Silica Nano-particle (10%) | Wt. ratio THV 340Z:PTFE 5032 | Pencil Hardness | Optical Quality |
| EX19 | 20 | NALCO 2329 | 70:30 | 2H | Good, thick haze and some white-yellow color |
| EX20 | 20 | NALCO 2329 | 50:50 | 2H | Good, thick haze and some white |
| EX21 | 20 | NALCO 2329 | 30:70 | 2H | Good, thick haze and some white |
| EX22 | 40 | NALCO 2329 | 70:30 | 2H | Good, thick haze and some white |
| EX23 | 40 | NALCO 2329 | 50:50 | 2H | Good, thick haze and some white |
| EX24 | 40 | NALCO 2329 | 30:70 | 2H | Good, thick haze and some white |
| EX25 | 40 | NALCO 2329 | 98:23 | 2H | Good, thick haze and some white |
| EX26 | 40 | NALCO 2329 | 90:10 | 2H | Good, thick haze and some white |
| EX27 | 40 | NALCO 2329 | 30:70 | 2H | Good, thick haze and some white |

This same set of experiments was conducted using NALCO 1115, NALCO 1050, NALCO 2329 instead of unmodified NALCO 2329. The NALCO 1115, NALCO 1050, NALCO 2329 were surface treated as described in PE1 and PE2 at 100% coverage. This set of experiments resulted in the same pencil hardness and optical quality.

Some additional coating compositions comprising a fluoropolymer having repeat units derived from VDF and a second fluoropolymer were made in the same manner as EX19-27 except that "ZBF500-1" was used instead of PTFE 5032. The wt-% solids of the components of the dried coating of Examples 28-30 were as follows. The formulations were coated with a #6 wire rod to provide a dried coating thickness of 10 to 15 microns.

| | THV340Z | ZBF500-1 | Silica Nanoparticles | APS | Pencil Hardness |
|---|---|---|---|---|---|
| EX 28 | 36% | 14.5% | 41.2% (NALCO 2329) | 8.2% | 2H |
| EX 29 | 23.9% | 9.6% | 58% (NALCO 2329) | 8.5% | 3H |
| EX 30 | 55.2 | 14.8 | 23.7% (NALCO 1050) | 7.1 | 3H |

For EX31-EX32 first THV 500 latex and fluoroelastomer latex were diluted to 20 wt. % using de-ionized (DI) water individually. To the diluted THV 500 latex was added various nanosilica dispersions with desired particle size so that the ratio of THV500 to silica nanoparticle dispersion was 90:10 by weight. Aqueous ammonium hydroxide was added to adjust the pH of the mixed dispersion to 9.5-10.5, and 3-(2-aminoethyl)aminopropyltrimethoxysilane (1 wt. % with respect to the total weight of the dispersion). Each of EX31-EX32 coating dispersions were coated on a corona treated PET substrate using #12 Meyer bar. The coated films were heated at 150-160° C. for 10 minutes to provide the desired fluoropolymer composite coating and the samples were tested for pencil hardness and the optical quality of the coatings were observed. The results were as follows:

| | Coating dispersion | | | | |
|---|---|---|---|---|---|
| Example | Fluoropolymer THV500 Dilution (89%) | Silica Nanoparticle (10%) | Wt. % APS (1%) | Pencil Hardness | Optical Quality |
| EX31 | 20 | Unmodified NALCO 2329 | 1 | 1-2H | hazy |
| EX32 | 20 | 100% epoxy modified NALCO 2329 | 1 | 2-3H | clear and very little color |

What is claimed is:

1. A fluoropolymer coating composition comprising:
   an aqueous liquid medium;
   fluoropolymer particles dispersed in the aqueous liquid medium wherein the fluoropolymer or fluoropolymer mixture comprises repeat units derived from VF, VDF, or a combination thereof and at least 45 mole-% of repeat units derived from TFE;
   inorganic oxide nanoparticles;
   a compound that reacts with the repeat units derived from VF and VDF to crosslink the fluoropolymer and/or couple the fluoropolymer to the inorganic oxide nanoparticles.

2. The fluoropolymer coating composition of claim 1 wherein the compound comprises at least two amino groups or at least one amino group and at least one alkoxy silane.

3. The fluoropolymer coating composition of claim 1 wherein the compound has a molecular weight no greater than 1000 g/mole.

4. The fluoropolymer coating composition of claim 1 wherein the compound is an amino-substituted organosilane ester or ester equivalent.

5. The fluoropolymer coating composition of claim 1 wherein the inorganic oxide nanoparticles are not surface modified.

6. The fluoropolymer coating composition of claim 1 wherein the inorganic oxide nanoparticles have a particle size of at least 30 nanometers.

7. The fluoropolymer coating composition of claim 1 wherein the inorganic oxide nanoparticles are surface modified with a hydrophilic surface treatment.

8. The fluoropolymer coating composition of claim 1 wherein the fluoropolymer further comprises repeat units derived from HFP, chlorotrifluoroethylene, or mixtures thereof.

9. The fluoropolymer coating composition of claim 1 wherein the coating composition comprises 20 to 95 wt-% solids of the fluoropolymer.

10. The fluoropolymer coating composition of claim 1 wherein the coating composition comprises 1 to 60 wt-% solids of inorganic oxide nanoparticles.

11. The fluoropolymer coating composition of claim 1 wherein the inorganic oxide nanoparticles comprise silica.

12. The fluoropolymer coating composition of claim 1 wherein the fluoropolymer further comprises repeat units derived from HFP.

13. The fluoropolymer coating composition of claim 1 wherein the fluoropolymer further comprises repeat units derived from vinyl ether.

14. The fluoropolymer coating composition of claim 1 wherein the fluoropolymer comprises 15 to 35 mole-% of repeat units derived from VF, VDF or a combination thereof.

15. A method of coating a substrate comprising providing a substrate and coating the substrate with the fluoropolymer coating composition of claim 1.

16. A coated substrate comprising a substrate wherein a surface of the substrate comprises the dried coating composition of claim 1.

17. The coated substrate of claim 16 wherein the substrate in an inorganic or polymeric substrate.

18. The coated substrate of claim 16 wherein the substrate is light transmissive.

19. A photovoltaic module comprising a backside film, the backside film comprising:
   at least one fluoropolymer comprising repeat units derived from VF, VDF, or a combination thereof and at least 45 mole-% of repeat units derived from TFE;
   inorganic oxide nanoparticles; and
   a compound that reacts with the repeat units derived from VF and VDF to crosslink the fluoropolymer and/or couple the fluoropolymer to the inorganic oxide nanoparticles.

20. The photovoltaic module of claim 19 wherein the fluoropolymer comprises 15 to 35 mole-% of repeat units derived from VF, VDF or a combination thereof.

21. The photovoltaic module of claim 19 wherein the fluoropolymer further comprises repeat units derived from HFP, chlorotrifluoroethylene, or mixtures thereof.

22. The fluoropolymer coating composition of claim 1 wherein the fluoropolymer further comprises repeat units derived from HFP.

* * * * *